(12) United States Patent
Biancarde Castro et al.

(10) Patent No.: US 12,647,120 B2
(45) Date of Patent: Jun. 2, 2026

(54) PLL LOCK DETECTOR CIRCUIT

(71) Applicant: Instituto de Pesquisas Eldorado,
Campinas (BR)

(72) Inventors: Mateus Biancarde Castro, Campinas
(BR); Eduardo Rodrigues de Lima,
Campinas (BR)

(73) Assignee: Instituto de Pesquisas Eldorado,
Campinas (BR)

( * ) Notice: Subject to any disclaimer, the term of this
patent is extended or adjusted under 35
U.S.C. 154(b) by 5 days.

(21) Appl. No.: 18/678,445

(22) Filed: May 30, 2024

(65) Prior Publication Data

US 2025/0373250 A1 Dec. 4, 2025

(51) Int. Cl.
H03L 7/087 (2006.01)
H03L 7/081 (2006.01)
H03L 7/083 (2006.01)

(52) U.S. Cl.
CPC ............ H03L 7/087 (2013.01); H03L 7/0818
(2013.01); H03L 7/083 (2013.01)

(58) Field of Classification Search
CPC ........ H03L 7/087; H03L 7/0818; H03L 7/083
See application file for complete search history.

(56) References Cited

U.S. PATENT DOCUMENTS 5,008,635 A   4/1991   Hanke
7,015,727 B2  3/2006   Balasubramanian
8,076,979 B2  12/2011  Kathuria 12,494,789  B2 *  12/2025  Roberts ................... H03L 7/091
2006/0022757  A1 *   2/2006  Jung ...................... H03L 7/0891
                                                    331/1 A
2009/0168944  A1 *   7/2009  Song ...................... H03K 5/153
                                                    375/376
2020/0162081  A1 *   5/2020  Jayakumar .............. H03L 7/093
2020/0403622  A1 *  12/2020  Ghotgalkar ........... H03L 7/0891
2025/0080123  A1 *   3/2025  Malakar ................ H03L 7/0802

FOREIGN PATENT DOCUMENTS

EP   3849086 A1   11/2021

OTHER PUBLICATIONS

Hovsepyan, "Lock Detector with Stable Parameters", 2009 4th
International Design and Test Workshop (IDT), Nov. 15-17, 2009,
IEEE.

* cited by examiner

*Primary Examiner* — Janice N Tieu
(74) *Attorney, Agent, or Firm* — André Grouwstra

(57) ABSTRACT

A lock-detection circuit designed for integration into a
phase-locked loop or a delay-locked loop includes a first
signal-duration filter processing an up signal (UP) to gen-
erate a filtered UP signal containing segments that exceed a
minimum duration, and a second signal-duration filter han-
dling a down signal (DN) to produce a filtered DN signal
with segments surpassing the minimum duration. Addition-
ally, the circuit includes first and second timers receiving the
filtered signals, and an output logic circuit triggering a
LOCK detected signal when both timers are activated. The
minimum duration is set to exceed spikes in the UP and DN
signals, accounting for jitter, and is longer than the expected
duration of a phase error correcting pulse when the loop is
in lock.

6 Claims, 6 Drawing Sheets

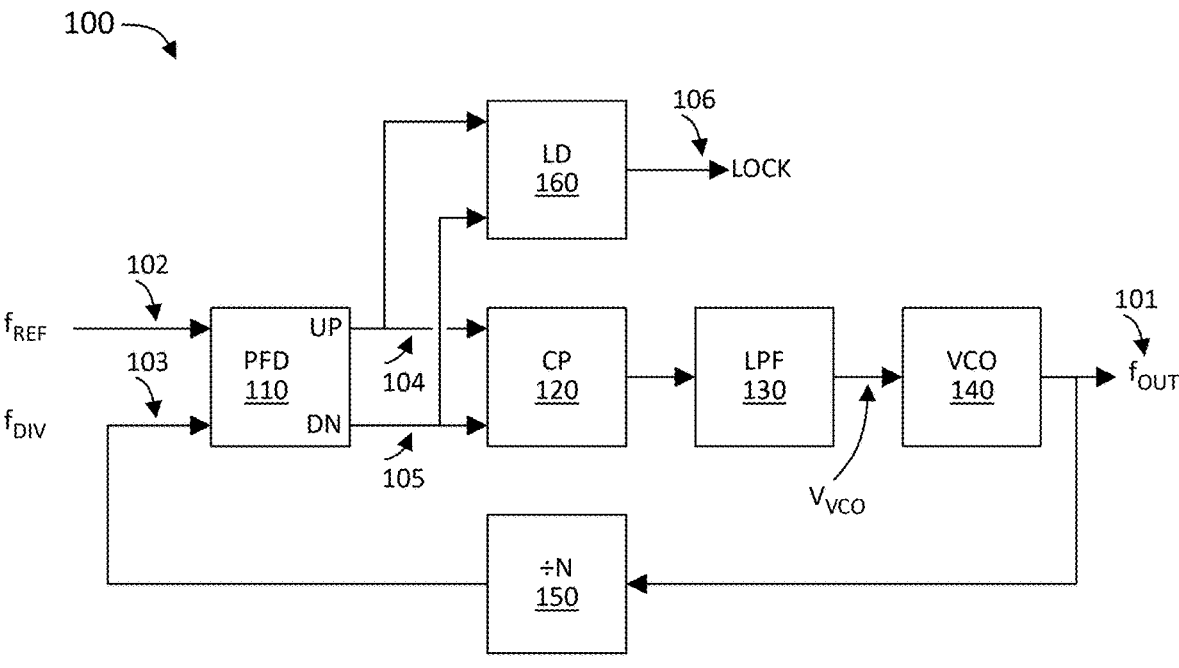
FIG. 1
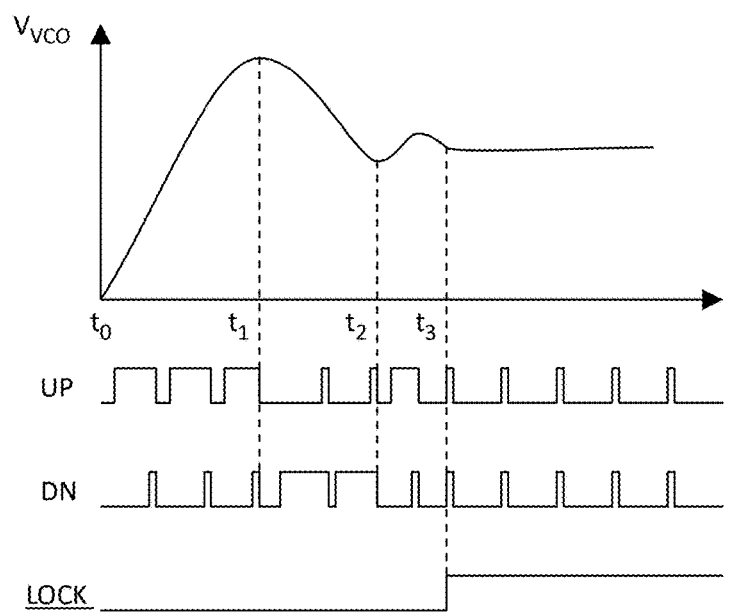
FIG. 2

300 —

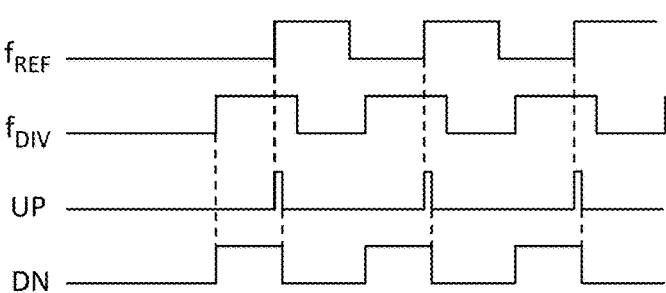

$f_{DIV}$ leads $f_{REF}$

UP goes up when $f_{REF}$ goes up
DN goes up when $f_{DIV}$ goes up
UP and DN reset when both $f_{DIV}$
and $f_{REF}$ are high

320 —

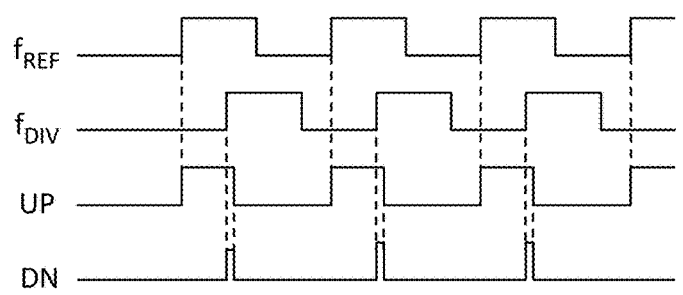

$f_{DIV}$ lags $f_{REF}$

UP goes up when $f_{REF}$ goes up
DN goes up when $f_{DIV}$ goes up
UP and DN reset when both $f_{DIV}$
and $f_{REF}$ are high

340 —

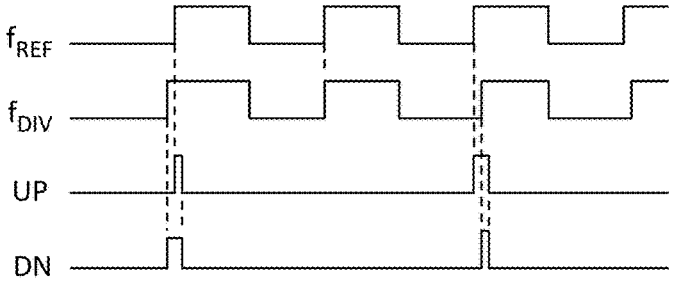

$f_{DIV}$ is locked to $f_{REF}$
There is jitter in pulses 1 and 3

UP goes up when $f_{REF}$ goes up
DN goes up when $f_{DIV}$ goes up
UP and DN reset when both $f_{DIV}$
and $f_{REF}$ are high

FIG. 3

160A
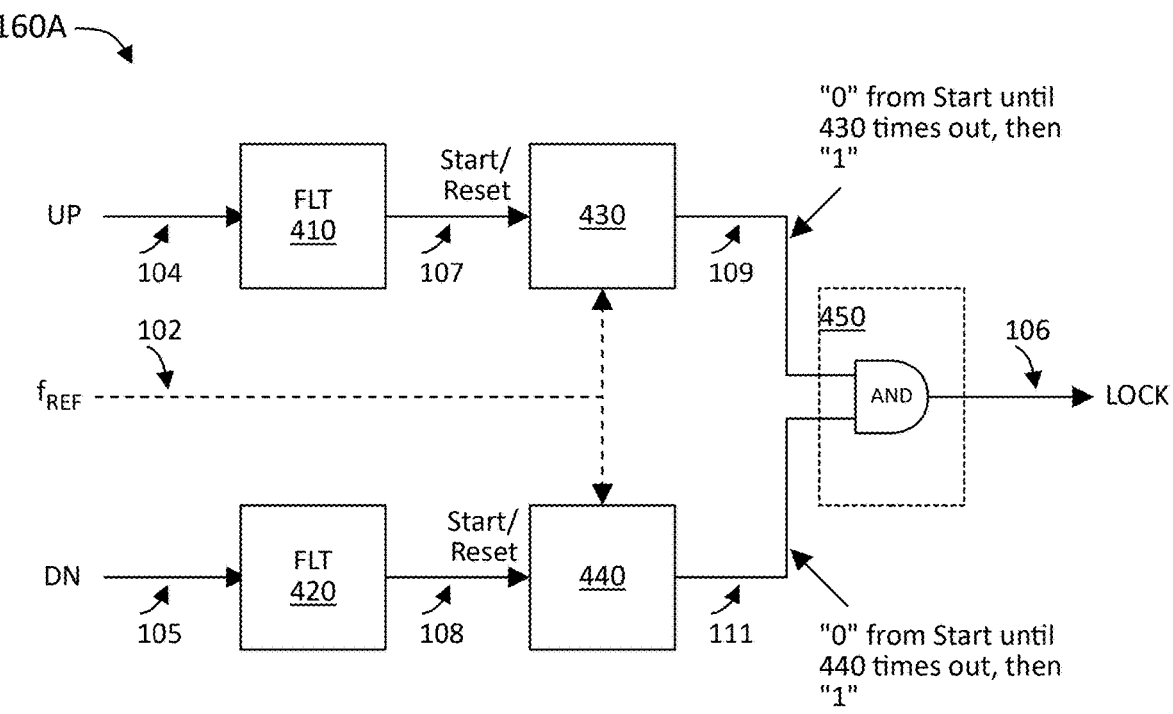
160B
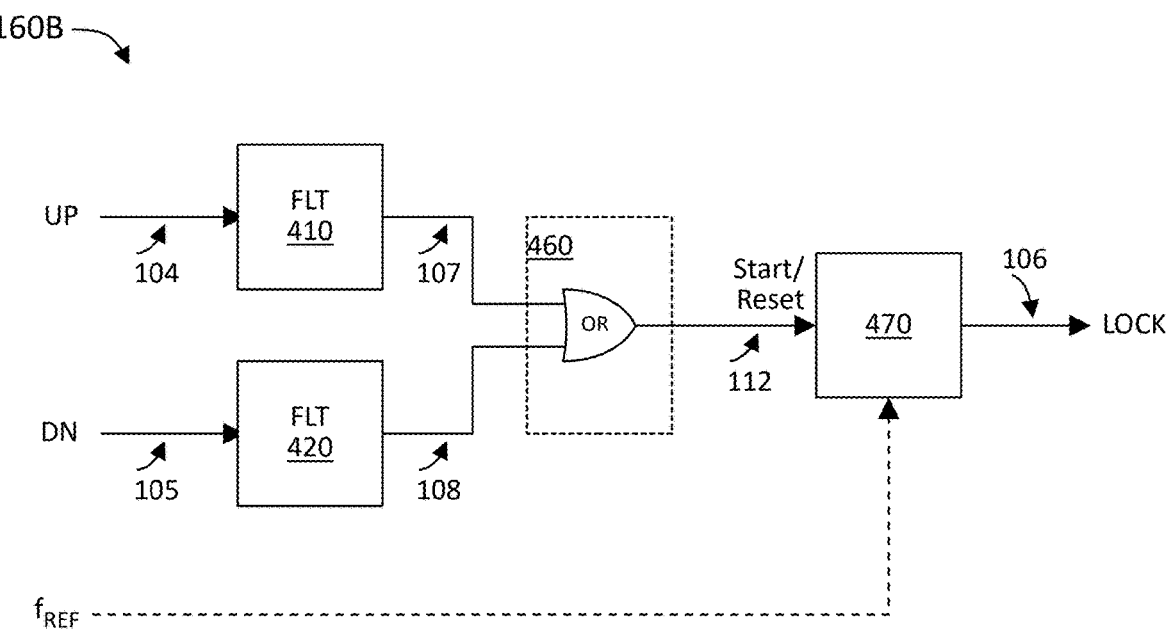
FIG. 4

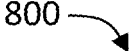
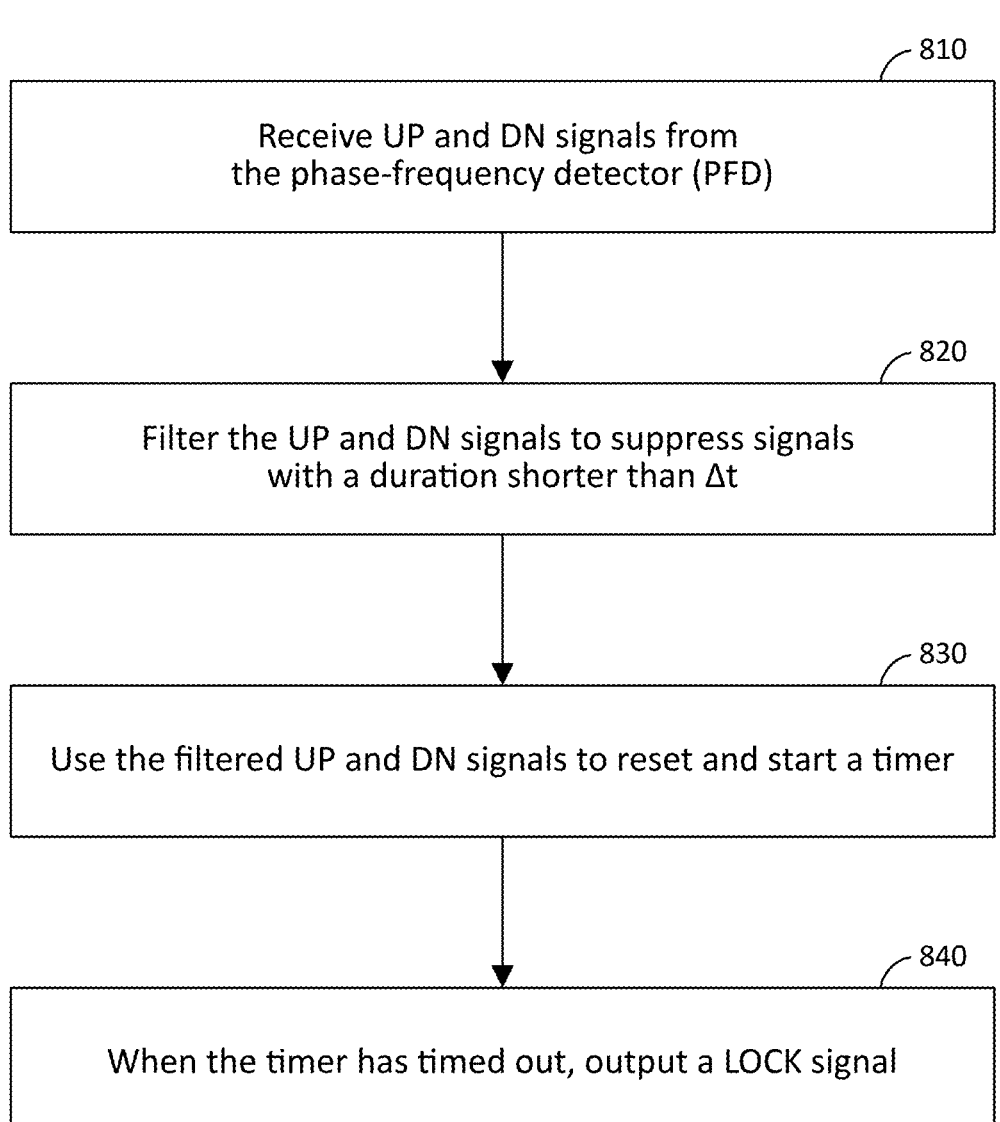
810
Receive UP and DN signals from
the phase-frequency detector (PFD)
820
Filter the UP and DN signals to suppress signals
with a duration shorter than Δt
830
Use the filtered UP and DN signals to reset and start a timer
840
When the timer has timed out, output a LOCK signal
FIG. 8

PLL LOCK DETECTOR CIRCUIT

BACKGROUND

Technical Field

The disclosed implementations relate generally to circuits and methods used in phase-locked loops (PLLs) and delay-locked loops (DLLs), and in particular to those for detecting whether the phase of the PLL or DLL output signal is locked to the phase of a reference input signal.

Context

Phase-locked loops and delay-locked loops are used in many systems to generate signals that are related to reference signals, but that may have a different frequency or a different start time. It takes some time for a PLL or DLL to synchronize to a new input signal, and in many cases a system needs to have an indication whether the PLL or DLL is synchronized. Lock detection circuits have been designed and made for many years. However, many are complicated.

BRIEF DESCRIPTION OF THE DRAWINGS

The technology will be described with reference to the drawings, in which:

FIG. 1 illustrates an example of a phase-locked loop with a lock detector.

FIG. 2 illustrates example timing diagrams of the voltage-controlled oscillator control voltage and some related continuous-time digital signals during and after the lock-in period.

FIG. 3 illustrates behavior of the phase-frequency detector (PFD) in the situations that the feedback phase leads the reference phase, lags the reference phase, and they are in lock.

FIG. 4 illustrates two architectural implementations of the lock detector.

FIG. 8 illustrates an example method for detecting phase lock.

Figure 5:
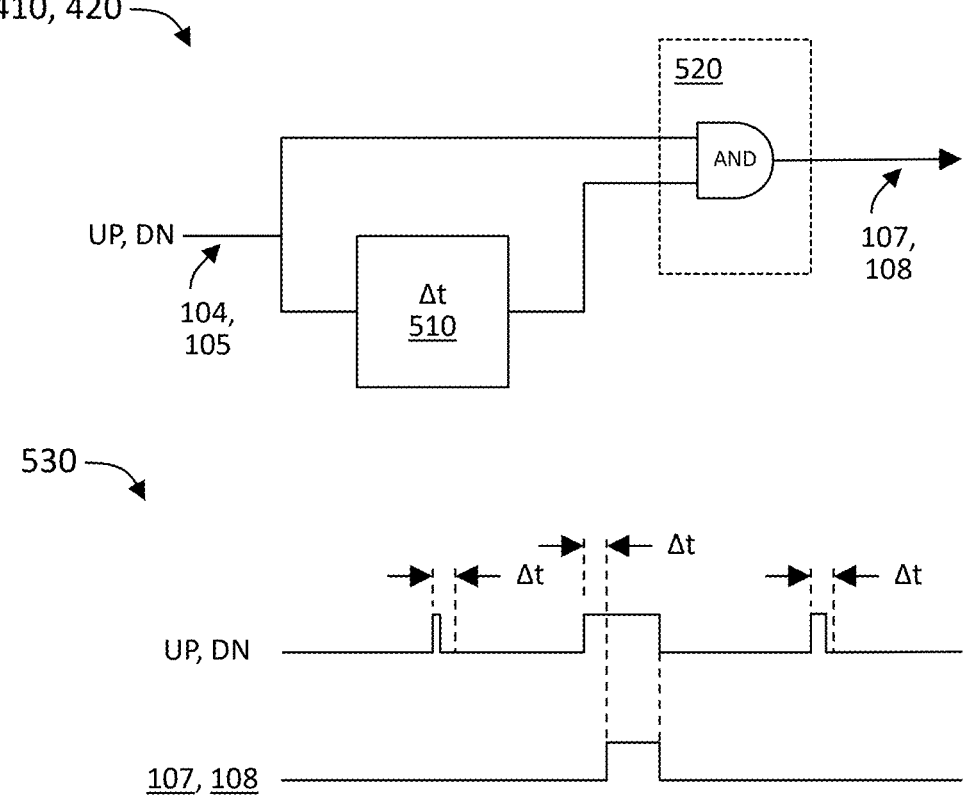
FIG. 5 illustrates an example signal-duration filter that can be used in the lock detector.

In the figures, like reference numbers may indicate functionally similar elements. The systems and methods illustrated in the figures—and described in the Detailed Description below—may be arranged and designed in a wide variety of different implementations. Neither the figures nor the Detailed Description are intended to limit the scope as claimed. Instead, they merely represent examples of different implementations.

DETAILED DESCRIPTION

Phase-locked loops and delay-locked loops are used in many systems to generate signals that are related to reference signals that may have a different frequency or a different start time. It takes some time for a PLL or DLL to synchronize to a new input signal, and in many cases a system needs to have an indication whether the PLL or DLL is synchronized. Lock detection circuits have been designed and made for many years. However, many are complicated.

This document discloses a simple method for lock detection, and several system and circuit implementations based on the method. The circuits use a small semiconductor die area and can be operated at a low power budget.

Terminology

As used herein, the phrase "one of" should be interpreted to mean exactly one of the listed items. For example, the phrase "one of A, B, and C" should be interpreted to mean any of: only A, only B, or only C.

As used herein, the phrases at least one of and one or more of should be interpreted to mean one or more items. For example, the phrase "at least one of A, B, or C" or the phrase "one or more of A, B, or C" should be interpreted to mean any combination of A, B, and/or C. The phrase "at least one of A, B, and C" means at least one of A and at least one of B and at least one of C.

Unless otherwise specified, the use of ordinal adjectives first, second, third, etc., to describe an object, merely refers to different instances or classes of the object and does not imply any ranking or sequence.

The terms "comprising" and "consisting" have different meanings in this patent document. An apparatus, method, or product "comprising" (or "including") certain features means that it includes those features but does not exclude the presence of other features. On the other hand, if the apparatus, method, or product "consists of" certain features, the presence of any additional features is excluded.

The term "coupled" is used in an operational sense and is not limited to a direct or an indirect coupling. "Coupled to" is generally used in the sense of directly coupled, whereas "coupled with" is generally used in the sense of directly or indirectly coupled. Coupled in an electronic system may refer to a configuration that allows a flow of information, signals, data, or physical quantities such as electrons between two elements coupled to or coupled with each other. In some cases, the flow may be unidirectional, in other cases the flow may be bidirectional or multidirectional. Coupling may be galvanic (in this context meaning that a direct electrical connection exists), capacitive, inductive, electromagnetic, optical, or through any other process allowed by physics.

The term "connected" is used to indicate a direct connection, such as electrical, optical, electromagnetic, or mechanical, between the things that are connected, without any intervening things or devices.

The term "configured" to perform a task or tasks is a broad recitation of structure generally meaning having circuitry that performs the task or tasks during operation. As such, the described item can be configured to perform the task even when the unit/circuit/component is not currently on or active. In general, the circuitry that forms the structure corresponding to configured to may include hardware circuits, and may further be controlled by switches, fuses, bond wires, metal masks, firmware, and/or software. Similarly, various items may be described as performing a task or tasks, for convenience in the description. Such descriptions should be interpreted as including the phrase configured to.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B". This phrase specifies that B is a factor that is used to determine A or that affects the determination of A. This phrase does not foreclose that the determination of A may also be based on some other factor, such as C. This phrase is also intended to cover an implementation in which A is determined based solely on B. The phrase based on is thus synonymous with the phrase based at least in part on.

The terms "substantially", "close", "approximately", "near", and "about" refer to being within minus or plus 10% of an indicated value, unless explicitly specified otherwise.

The following terms or acronyms used herein are defined at least in part as follows:

"ASIC"—application-specific integrated circuit
"CCO"—current-controlled oscillator
"CP"—charge pump
"DCO"—digitally controlled oscillator
"DLL"—delay-locked loop
"IC"—integrated circuit—a monolithically integrated circuit, i.e., a single semiconductor die which may be delivered as a bare die or as a packaged circuit. For the purposes of this document, the term integrated circuit also includes packaged circuits that include multiple semiconductor dies, stacked dies, or multiple-die substrates. Such constructions are now common in the industry, produced by the same supply chains, and for the average user often indistinguishable from monolithic circuits.
"LPF"—loop filter
"MCM"—multichip module
"PCB"—printed circuit board
"PFD"—phase-frequency detector
"PLL"—phase-locked loop
"UP"—up signal
"VCO"—voltage-controlled oscillator.
Implementations FIG. 1 illustrates an example of a phase-locked loop 100 (PLL) with a lock detector 160 (a lock-detection circuit LD). Phase-locked loop 100 further comprises a phase-frequency detector (PFD 110), a charge pump 120 (CP), a loop filter 130 (LPF), a controlled oscillator 140, which in the case drawn is a voltage-controlled oscillator (VCO), and a feedback divider 150 that divides an output signal frequency $f_{OUT}$ by a factor of N to obtain a feedback signal whose frequency $f_{DIV}$ equals $f_{OUT}/N$. In the case drawn, charge pump 120, loop filter 130, and controlled oscillator 140 are analog/mixed-signal (AMS) blocks, but in other implementations, a charge pump may not be needed, the loop filter may be digital, and/or the controlled oscillator may be a current-controlled oscillator or a digitally controlled oscillator. Some implementations may not have a feedback divider, which means that the frequency of the feedback signal $f_{DIV}$ equals the output frequency. However, all implementations in the technology disclosed herein include PFD 110.

Although FIG. 1 illustrates the use of lock detector 160 in a phase-locked loop, it can also be used in a delay-locked loop that incorporates a phase-frequency detector.

The operation of PLLs is well-known in the art and is concisely summarized here for completeness. A PLL is used to generate an output signal 101, whose phase and frequency $f_{OUT}$ is related to the phase and frequency $f_{REF}$ of a reference signal 102. Output signal 101 is generated by controlled oscillator 140, whose phase and frequency are controlled by a control signal—in this case a control voltage $V_{VCO}$. For example, if the control voltage rises, $f_{OUT}$ rises, and if the control voltage drops, $f_{OUT}$ drops. The relationship between $f_{OUT}$ and $f_{REF}$ is determined by the feedback divider value N, which may be an integer or a real number, i.e., an integer plus a fraction. The feedback signal 103 is compared with the reference signal 102 in PFD 110, which determines if the phase and frequency of the two signals is equal, or needs adjustment. PFD 110 outputs an UP signal 104 and a DN signal 105 (DN stands for down). The UP signal 104 indicates that controlled oscillator 140 must oscillate at a higher frequency, and the DN signal 105 indicates that controlled oscillator 140 must oscillate at a lower frequency. To ensure stability, loop filter 130 limits the speed of changes. Loop filter 130 includes a low-pass filter (LPF), which may include an integration, and it may have further features to optimize stability, speed, and accuracy, as is known in control theory. If loop filter 130 is an analog filter, then usually a PLL also includes a charge pump, which processes the PFD output signals to be suitable for the loop filter. If loop filter 130 is a digital filter, no charge pump is needed. Instead, some systems convert the loop filter digital output signal to an analog signal suitable for a VCO or a current-controlled oscillator (CCO). In so-called "all-digital" PLLs, the loop filter digital output signal directly controls the digitally controlled oscillator (DCO).

Before a PLL has locked its output signal to the reference signal, for instance on startup or when the reference signal is first applied, the PLL goes through a lock-in phase. During that phase, which often needs to be very short, the frequency of the output signal can make large swings, and the output signal may not yet be suitable for its intended purpose. Thus, lock detector 160 is added to indicate through a LOCK detected signal 106 whether the PLL is in sync (has locked to the reference frequency) or not. Prior to reaching its steady state, output signal 101 may several times transition the desired phase and frequency, but lock detector 160 must not yet indicate that the system is in lock. Another requirement for lock detectors is that they must be robust against noise and other disturbances that could falsely trigger a LOCK indication.

FIG. 2 illustrates example timing diagrams 200 of the voltage-controlled oscillator control voltage $V_{VCO}$ and some related continuous-time digital signals during and after the lock-in period. At time $t_0$, controlled oscillator 140 starts up with an initial frequency that is determined by its design, as well as manufacturing process variations, the temperature, and the supply voltage. Its frequency $f_{OUT}$ may be lower than required by $f_{REF}$, so the control voltage $V_{VCO}$ must be high. However, the loop filter output may not have an initial value, so $V_{VCO}$ starts from zero volts. In this situation, PFD 110 compares feedback signal 103 with reference signal 102, and determines that $f_{DIV}$ is too low compared with $f_{REF}$, so it may output long pulses on its UP output and brief spikes on its DN output (for purposes of illustration, the length and cycle time of the UP and DN pulses is greatly exaggerated—in reality there will be many more pulses during the time depicted in FIG. 2). At time $t_1$, PFD 110 determines that $f_{DIV}$ is too high compared with $f_{REF}$, and it starts outputting long pulses on its DN output and short pulses on its UP output. At time $t_2$, the situation reverses again, but the differences are much smaller, and at time $t_3$ phase-locked loop 100 reaches a steady state: it is locked in. Although small adjustments of the $V_{VCO}$ signal happen to maintain its lock, the adjustments are small enough to be acceptable. Both the UP and DN outputs now only output brief spikes. Once lock detector 160 has determined that the system is in lock, it asserts the LOCK signal—in this example by raising its level from low to high.

FIG. 3 illustrates behavior of PFD 110 in the situations that the feedback phase leads the reference phase, lags the reference phase, and they are in LOCK. UP signal 104 can only be asserted when reference signal 102 is asserted, and DN signal 105 can only be asserted when feedback signal 103 is asserted. However, when both reference signal 102 and feedback signal 103 are asserted, both UP signal 104 and DN signal 105 de-assert. De-assertion takes some time, during which the last signal to assert may show a brief spike. The timing diagrams 300 show feedback signal 103 leading reference signal 102. The DN signal gets asserted first (when feedback signal 103 is asserted). It is later followed by the UP signal when reference signal 102 is asserted, immediately upon which both signals de-assert. Thus, when feedback signal 103 leads reference signal 102, the UP signal 104 shows a series of spikes and DN signal 105 shows a series of longer pulses.

Timing diagrams 320 show reference signal 102 being asserted before feedback signal 103. As a result, UP signal 104 asserts first, later followed by DN signal 105, immediately upon which both UP signal 104 and DN signal 105 de-assert. Thus, when reference signal 102 leads feedback signal 103, the UP signal 104 shows a series of longer pulses and the DN signal 105 shows a series of spikes.

The timing diagrams 340 show reference signal 102 and feedback signal 103 being in sync, although there is a bit of jitter. For example, for the first pulse of each shown, feedback signal 103 slightly leads reference signal 102. Although both the resulting UP signal 104 and DN signal 105 are spikes, the spike of DN signal 105 is slightly wider. The second pulse of each is perfectly in sync. In this example, no spikes occur for either UP signal 104 or DN signal 105. For the third pulse of each, reference signal 102 slightly leads feedback signal 103. Thus, UP signal 104 is a slightly wider spike than DN signal 105. The fourth pulses are perfectly in sync again, and neither UP signal 104 nor DN signal 105 spikes.

FIG. 4 illustrates two architectural implementations of the lock detector. Lock detector 160A includes first signal-duration filter 410 and second signal-duration filter 420, first timer 430 and second timer 440, and output logic circuit 450. First signal-duration filter 410 receives UP signal 104 and second signal-duration filter 420 receives DN signal 105. First signal-duration filter 410 outputs filtered UP signal 107, which includes a part of UP signal 104 that exceeds a minimum duration $\Delta t$. Second signal-duration filter 420 outputs filtered DN signal 108, which includes a part of DN signal 105 that exceeds the minimum duration $\Delta t$. In implementations, the minimum duration $\Delta t$ is longer than the spikes occurring in UP signal 104 and DN signal 105 described with reference to FIG. 3, including lengthened spikes due to jitter as illustrated in timing diagrams 340. The minimum duration $\Delta t$ is also longer than the expected duration of a phase error correcting pulse when the PLL or DLL is in lock. First timer 430 has a start/reset input coupled with the output of first signal-duration filter 410, and receiving filtered UP signal 107. Second timer 440 has a start/reset input coupled with the output of second signal-duration filter 420, and receiving filtered DN signal 108. First timer 430 and second timer 440 may be analog timers (for example including a monostable multivibrator), in which case their inputs might be start inputs; or digital timers, in which case their inputs might be reset inputs. If they are digital timers, for example counters or shift registers, they may receive reference signal 102 or another clock signal on a clock input as a time reference. First timer 430 de-asserts its output (first timer output signal 109) when its start/reset input is asserted, and asserts its output a first wait time $t_{w1}$ after the start/reset input was most recently asserted. The first wait time $t_{w1}$ is longer than the longest cycle time of reference signal 102 and longer than the longest cycle time of feedback signal 103. For example, if first timer 430 receives a start/reset signal at $t_1$ and another start/reset signal at $t_2$, but the time between $t_2$ and $t_1$ is shorter than the first wait time $t_{w1}$, then first timer 430 times out and asserts its output at time $t_3 = t_2 + t_{w1}$. Similarly, second timer 440 de-asserts its output (second timer output signal 111) when its start/reset input is asserted, and asserts its output a second wait time $t_{w2}$ after its start/reset input was most recently asserted. The second wait time $t_{w2}$ is longer than the longest cycle time of reference signal 102 and longer than the longest cycle time of feedback signal 103. Output logic circuit 450 has inputs coupled with the outputs of first timer 430 and second timer 440. It is configured to assert the LOCK detected signal 106 at its output when the outputs of both first timer 430 and second timer 440 are asserted. Output logic circuit 450 may include one or more logic gates in a combinational logic circuit. For example, in the case drawn, first timer output signal 109 and second timer output signal 111 are de-asserted LOW and asserted HIGH. If LOCK detected signal 106 is also de-asserted LOW and asserted HIGH, output logic circuit 450 may simply include an AND gate. If LOCK detected signal 106 is deasserted HIGH and asserted LOW, output logic circuit 450 may simply include a NAND gate, and so on.

The operation of lock detector 160A is as follows. When reference signal 102 leads feedback signal 103, UP signal 104 has long pulses and DN signal 105 has spikes. First signal-duration filter 410 shortens the long pulses in UP signal 104, but provides remaining pulses in filtered UP signal 107. Second signal-duration filter 420 eliminates the spikes in DN signal 105, because they are shorter than the minimum duration $\Delta t$. Thus, filtered DN signal 108 is de-asserted. The pulses in UP signal 104, and thus in filtered UP signal 107, arrive at intervals equal to the cycle time of reference signal 102. As a result, filtered UP signal 107 resets first timer 430 once every cycle of reference signal 102. Each reset de-asserts first timer output signal 109, and first timer 430 cannot assert it because the resets occur faster than first wait time $t_{w1}$. Because first timer output signal 109 remains de-asserted, output logic circuit 450 cannot assert LOCK detected signal 106.

Similarly, when feedback signal 103 leads reference signal 102, output logic circuit 450 cannot assert LOCK detected signal 106.

However, when the PLL (or DLL) reaches synchronization, both UP signal 104 and DN signal 105 lack long pulses. They may include spikes, including those for correcting small phase errors when the PLL or DLL is in lock and including spikes due to jitter of the reference signal or the feedback signal, but these spikes get filtered out by first signal-duration filter 410 and second signal-duration filter 420, so that both filtered UP signal 107 and filtered DN signal 108 are no longer asserted. This stops the periodic resetting of first timer 430 (if reference signal 102 was leading) or second timer 440 (if feedback signal 103 was leading). The timer times out after first wait time $t_{w1}$ or second wait time $t_{w2}$, after which both timers will have asserted outputs. Both first timer output signal 109 and second timer output signal 111 are asserted, so output logic circuit 450 asserts its output providing the LOCK detected signal 106.

Lock detector 160B is a variation of lock detector 160A, saving one timer. Lock detector 160B includes first signal-duration filter 410, second signal-duration filter 420, filter logic circuit 460 with inputs coupled with an output of the first signal-duration filter 410 and an output of the second signal-duration filter 420. A timer 470 has a start/reset input coupled with an output of filter logic circuit 460. Its output provides the LOCK detected signal 106.

The operation of first signal-duration filter 410 and second signal-duration filter 420 has been described with reference to lock detector 160A. They output filtered UP signal 107 and filtered DN signal 108. Filter logic circuit 460 outputs the start/reset signal 112 and is configured to assert its output when the filtered UP signal 107 and/or the filtered DN signal 108 is asserted. Filter logic circuit 460 may include one or more logic gates in a combinational logic circuit. For example, in the case drawn, filtered UP signal 107 and filtered DN signal 108 may be de-asserted LOW and asserted HIGH. If start/reset signal 112 is also de-asserted LOW and asserted HIGH, filter logic circuit 460 may simply include an OR gate.

Timer 470 de-asserts its output (the LOCK detected signal 106) when its start/reset input is asserted and asserts its output a third wait time $t_{w3}$ after the start/reset input was most recently asserted. The third wait time $t_{w3}$ is longer than the longest cycle time of reference signal 102 and longer than the longest cycle time of feedback signal 103. For example, if timer 470 receives a start/reset signal at $t_1$ and another start/reset signal at $t_2$, but the time between $t_2$ and $t_1$ is shorter than the first wait time $t_{w3}$, then timer 470 times out and asserts its output at time $t_3 = t_2 + t_{w3}$. Timer 470 may be an analog timer (for example including a monostable multivibrator), in which case its inputs might be a start input; or a digital timer, in which case its input might be a reset input. If it is a digital timer, for example a counter or a shift register, it may receive reference signal 102 or another clock signal on a clock input as a time reference.

The operation of lock detector 160B is as follows. When reference signal 102 leads feedback signal 103, UP signal 104 has long pulses and DN signal 105 has spikes. First signal-duration filter 410 shortens the long pulses in UP signal 104, but provides remaining pulses in filtered UP signal 107. Second signal-duration filter 420 eliminates the spikes in DN signal 105, because they are shorter than the minimum duration Δt. Thus, filtered DN signal 108 is de-asserted. The pulses in UP signal 104, and thus in filtered UP signal 107, arrive at intervals equal to the cycle time of reference signal 102. Filter logic circuit 460 passes the pulses in UP signal 104 on to timer 470, which then resets once every cycle of reference signal 102. Each reset de-asserts LOCK detected signal 106, and timer 470 cannot assert it because the resets occur faster than third wait time $t_{w3}$.

Similarly, when feedback signal 103 leads reference signal 102, filtered UP signal 107 is de-asserted, and pulses in filtered DN signal 108 once every cycle of feedback signal 103 keep resetting timer 470 before it can assert LOCK detected signal 106. Thus, LOCK detected signal 106 remains de-asserted as long as one of reference signal 102 and feedback signal 103 leads the other. However, when the PLL or DLL achieves synchronization, the pulses in both filtered UP signal 107 and filtered DN signal 108 stop, and timer 470 can no longer reset. It times out and asserts LOCK detected signal 106.

FIG. 5 illustrates an example signal-duration filter that can be used in the lock detector. The circuit can be used for both first signal-duration filter 410 and second signal-duration filter 420. It includes a logic circuit 520 with a first logic circuit input and a second logic circuit input, and a delay circuit 510 with a delay circuit input. The first logic circuit input and the delay circuit input are coupled with the signal input (to receive UP signal 104 or DN signal 105), the second logic circuit input is coupled with the output of delay circuit 510, and the logic circuit 520 output is coupled with the signal-duration filter output. Delay circuit 510 delays signals with a delay equal to the minimum duration Δt, providing a delayed input signal at its output. Logic circuit 520 asserts its output when both the first logic circuit input and the second logic circuit input are asserted. Logic circuit 520 includes one or more logic gates in a combinational logic circuit. For example, if both its inputs and its output are de-asserted LOW and asserted HIGH, logic circuit 520 may simply include an AND gate.

Timing diagram 530 shows an example input signal (UP signal 104 or DN signal 105) with three pulses. The first pulse is a spike, shorter than the minimum duration Δt. Thus, the delayed input pulse at the output of delay circuit 510 occurs after the original input pulse has ended. This means that there is no overlap in the assertion of the first logic circuit input and the second logic circuit input, and logic circuit 520 does not assert its output. The spike is too short and has been eliminated.

The second pulse in the input signal is a long pulse. That is, it is longer than the minimum duration Δt. During the Δt interval, only one of the two inputs of logic circuit 520 is asserted, and there is no output pulse. During the remainder of the input pulse, there is overlap of the input pulse and the delayed input pulse, and the output is asserted. The pulse is shortened, but not eliminated.

The third pulse in the input signal is a spike, but it is widened because of jitter in the reference signal 102 or the feedback signal 103, or because it is a legitimate error signal to keep the PLL/DLL negative feedback loop locked. However, it is still shorter than the minimum duration Δt, and therefore it is eliminated.

Figure 6:
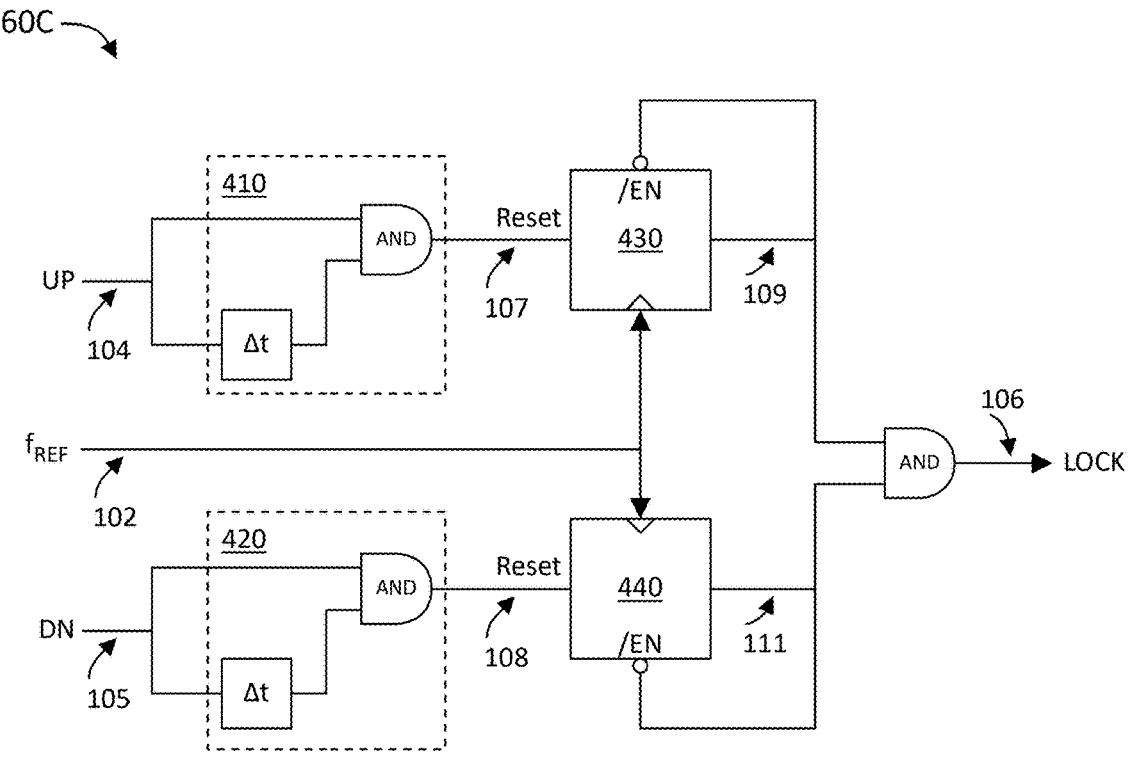
FIG. 6 illustrates an implementation of an architecture of FIG. 4 of the lock detector.

FIG. 6 illustrates an implementation of an architecture of FIG. 4 of the lock detector. Lock detector 160C includes the first signal-duration filter 410 and second signal-duration filter 420 implementation of FIG. 5 to provide filtered UP signal 107 and filtered DN signal 108 to first timer 430 and second timer 440, respectively. In this implementation, first timer 430 is a digital counter with a reset input to receive filtered UP signal 107 and a clock input to receive reference signal 102. It has an enable input (/EN) coupled with its output. Second timer 440 is a digital counter with a reset input to receive filtered DN signal 108 and a clock input to receive reference signal 102. It also has an enable input (/EN) coupled with its output. The enable inputs (/EN) are asserted LOW and de-asserted HIGH. The first timer output signal 109 and second timer output signal 111 are asserted HIGH and de-asserted LOW. LOCK detected signal 106 too is asserted HIGH and de-asserted LOW.

Lock detector 160C includes first signal-duration filter 410 configured to receive UP signal 104 and to output filtered UP signal 107 that includes a part of the UP signal that exceeds a minimum duration Δt. The second signal-duration filter 420 is configured to receive DN signal 105 and to output filtered DN signal 108 that includes a part of the DN signal that exceeds the minimum duration Δt. The minimum duration Δt is longer than a spike in UP signal 104, including a spike broadened by jitter, and longer than a spike in DN signal 105, including a spike broadened by jitter.

First signal-duration filter 410 includes a first logic circuit with a first logic circuit input and a second logic circuit input, and a delay circuit with a delay circuit input. The first logic circuit input and the delay circuit input are coupled with an UP signal input, the second log circuit input is coupled with an output of the delay circuit, and a first logic circuit output is coupled with a first signal-duration filter output. The delay circuit outputs a delayed UP signal, wherein the delayed UP signal follows the UP signal with a delay equal to the minimum duration. The first logic circuit asserts its output when both the first logic circuit input and the second logic circuit input are asserted.

Figure 7:
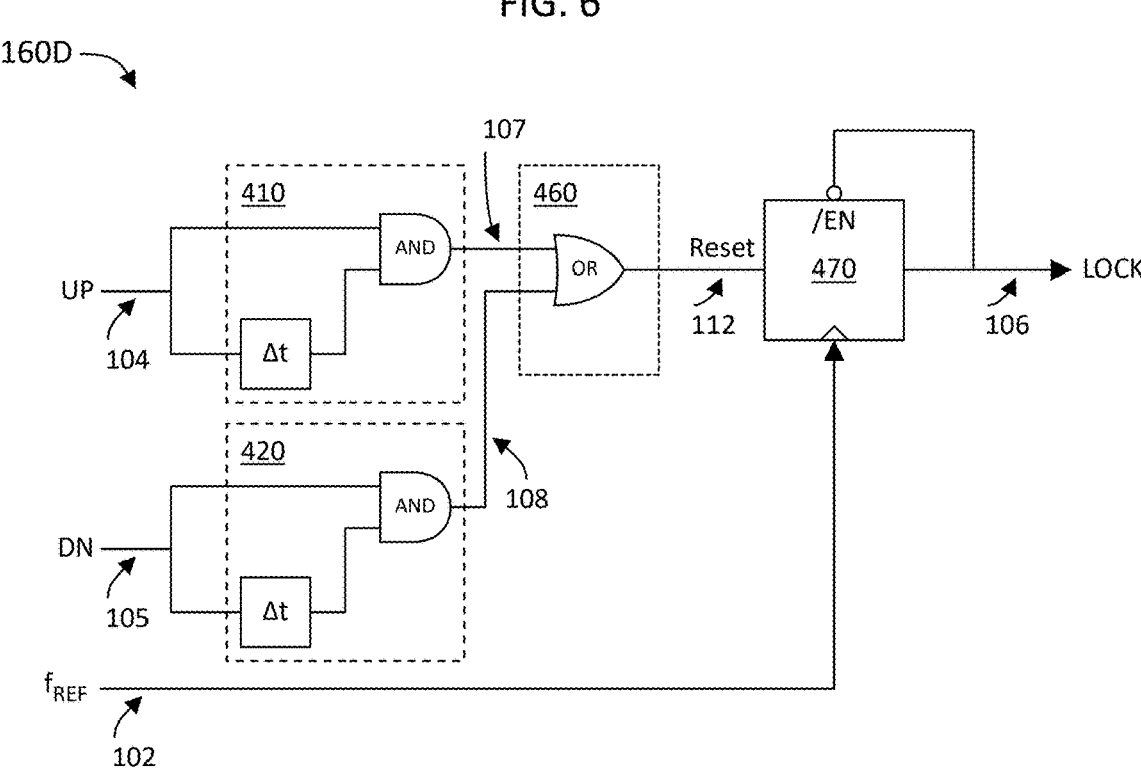
FIG. 7 illustrates another implementation of an architecture of FIG. 4 of the lock detector.

FIG. 7 illustrates another implementation of an architecture of FIG. 4 of the lock detector. Lock detector 160D includes the first signal-duration filter 410 and second signal-duration filter 420 implementation of FIG. 5 to provide filtered UP signal 107 and filtered DN signal 108 to filter logic circuit 460. In this implementation, timer 470 is a digital counter with a reset input to receive the filter logic circuit 460 output signal (start/reset signal 112) and a clock input to receive reference signal 102. It has an enable input (/EN) coupled with its output. Again, the enable input (/EN) is asserted LOW and de-asserted HIGH. LOCK detected signal 106 is asserted HIGH and de-asserted LOW.

Lock detector 160D includes first signal-duration filter 410 configured to receive UP signal 104 and to output filtered UP signal 107 that includes a part of the UP signal that exceeds a minimum duration Δt. The second signal-duration filter 420 is configured to receive DN signal 105 and to output filtered DN signal 108 that includes a part of the DN signal that exceeds the minimum duration Δt. Filter logic circuit 460 has inputs coupled with an output of first signal-duration filter 410 and an output of second signal-duration filter 420, and is configured to assert its output when filtered UP signal 107 and/or filtered DN signal 108 is asserted. Timer 470 has a start/reset input coupled with an output of the filter logic circuit and is configured to assert LOCK detected signal 106 the third wait time after the start/reset input was most recently asserted. The minimum duration Δt is longer than a spike in UP signal 104, including a spike broadened by jitter, and longer than a spike in DN signal 105, including a spike broadened by jitter.

First signal-duration filter 410 includes a first logic circuit with a first logic circuit input and a second logic circuit input, and a delay circuit with a delay circuit input. The first logic circuit input and the delay circuit input are coupled with an UP signal input, the second log circuit input is coupled with an output of the delay circuit, and a first logic circuit output is coupled with a first signal-duration filter output. The delay circuit outputs a delayed UP signal, wherein the delayed UP signal follows the UP signal with a delay equal to the minimum duration. The first logic circuit asserts its output when both the first logic circuit input and the second logic circuit input are asserted.

FIG. 8 illustrates an example method 800 for detecting phase lock in a PLL or DLL, using the UP signal and DN signal from a PFD. Method 800 comprises:

Step 810—receive the UP signal and the DN signal from the PFD. The PFD is used in the PLL or DLL to compare the phase and frequency of a feedback signal with the phase and frequency of a reference signal.

Step 820—filter the UP signal and the DN signal to suppress signals with a duration shorter than a minimum duration Δt to obtain a filtered UP signal and a filtered DN signal. The minimum duration Δt is longer than a spike in the UP signal, including a spike broadened by jitter, and longer than a spike in the DN signal, including a spike broadened by jitter. The jitter may be in the phase of the feedback signal or in the phase of the reference signal. The minimum duration Δt is also longer than the expected duration of phase error correcting pulses when the PLL or DLL is in lock.

Step 830—use the filtered UP signal and the filtered DN signal to reset and start a first timer. When the first timer receives a pulse in the filtered UP signal or a pulse in the filtered DN signal, it de-asserts its output. The first timer then waits a first wait time, and keeps monitoring the filtered UP signal and/or the filtered DN signal for pulses. When it receives another pulse in the filtered UP signal and/or the filtered DN signal, it resets and restarts to wait for a new period of the first wait time.

Step 840—when the first wait time has passed, without the first timer having received another pulse in the filtered UP signal or in the filtered DN signal, the first timer asserts its output to indicate LOCK detection.

In some implementations, the first timer is configured to receive the filtered UP signal, and a second timer is configured to receive the filtered DN signal. In those implementations, indicating the LOCK detection includes combining the output signals from the first timer and the second timer, for example in a combinational logic circuit. The output of the combinational logic circuit is asserted only when both the output of the first timer and the output of the second timer are asserted.

Particular Implementations

Described implementations of the subject matter can include one or more features, alone or in combination, as described in the following clauses.

Clause 1. A lock-detection circuit for use in a phase-locked loop or a delay-locked loop, the lock-detection circuit comprising:

a first signal-duration filter configured to receive an up signal (UP) and to output a filtered UP signal that includes a part of the UP signal that exceeds a minimum duration;

a second signal-duration filter configured to receive a down signal (a DN signal) and to output a filtered DN signal that includes a part of the DN signal that exceeds the minimum duration;

a first timer coupled with an output of the first signal-duration filter and configured to receive the filtered UP signal;

a second timer coupled with an output of the second signal-duration filter and configured to receive the filtered DN signal; and an output logic circuit with inputs coupled with the first timer and the second timer and configured to assert a LOCK detected signal when both a first timer output and a second timer output are asserted;

wherein:

the minimum duration is longer than a spike in the UP signal, including a spike broadened by jitter, and longer than a spike in the DN signal, including a spike broadened by jitter; and the minimum duration is longer than an expected duration of a phase error correcting pulse when the phase-locked loop or the delay-locked loop is in lock.

Clause 2. The lock-detection circuit of clause 1, wherein:

the first signal-duration filter includes a first logic circuit with a first logic circuit input and a second logic circuit input, and a delay circuit with a delay circuit input and a delay circuit output;

the first logic circuit input and the delay circuit input are coupled with an UP signal input, the second logic circuit input is coupled with the delay circuit output, and a first logic circuit output is coupled with a first signal-duration filter output;

the delay circuit outputs a delayed UP signal, wherein the delayed UP signal follows the UP signal with a delay equal to the minimum duration; and the first logic circuit asserts its output when both the first logic circuit input and the second logic circuit input are asserted.

Clause 3. The lock-detection circuit of clause 1 or clause 2, wherein:

the first timer is a counter with a reset input coupled with an output of the first signal-duration filter, a clock input coupled with a reference signal input, and an enable input coupled with a first timer output;

the first timer is configured to de-assert the first timer output when its reset input is asserted and to assert the first timer output a first wait time after the reset input was most recently asserted; and the first wait time is longer than a longest first cycle time of a reference signal and longer than a longest second cycle time of a feedback signal.

Clause 4. The lock-detection circuit of any of the clauses 1 to 3, wherein:

the first timer is an analog timer with a start input coupled with an output of the first signal-duration filter; and the first timer is configured to assert the first timer output a first wait time after the start input was most recently asserted.

Clause 5. A lock-detection circuit for use in a phase-locked loop or a delay-locked loop, the lock-detection circuit comprising:

a first signal-duration filter configured to receive an up signal (UP) and to output a filtered UP signal that includes a part of the UP signal that exceeds a minimum duration;

a second signal-duration filter configured to receive a down signal (a DN signal) and to output a filtered DN signal that includes a part of the DN signal that exceeds the minimum duration;

a filter logic circuit with inputs coupled with an output of the first signal-duration filter and an output of the second signal-duration filter, and configured to assert a filter logic circuit output when the filtered UP signal and/or the filtered DN signal is asserted; and a first timer with a start/reset input coupled with an output of the filter logic circuit and configured to assert a LOCK output signal a third wait time after the start/reset input was most recently asserted;

wherein:

the minimum duration is longer than a spike in the UP signal, including a spike broadened by jitter, and longer than a spike in the DN signal, including a spike broadened by jitter; and the minimum duration is longer than an expected duration of a phase error correcting pulse when the phase-locked loop or the delay-locked loop is in lock.

Clause 6. The lock-detection circuit of clause 5, wherein:

the first signal-duration filter includes a first logic circuit with a first logic circuit input and a second logic circuit input, and a delay circuit with a delay circuit input and a delay circuit output;

the first logic circuit input and the delay circuit input are coupled with an UP signal input, the second logic circuit input is coupled with the delay circuit output, and a first logic circuit output is coupled with a first signal-duration filter output;

the delay circuit outputs a delayed UP signal, wherein the delayed UP signal follows the UP signal with a delay equal to the minimum duration; and the first logic circuit asserts its output when both the first logic circuit input and the second logic circuit input are asserted.

Clause 7. The lock-detection circuit of clause 5 or clause 6, wherein:

the first timer is a counter with a clock input coupled with a reference signal input, and an enable input coupled with a first timer output;

the first timer is configured to de-assert the first timer output when its start/reset input is asserted and to assert the first timer output a first wait time after the start/reset input was most recently asserted; and the first wait time is longer than a longest first cycle time of a reference signal and longer than a longest second cycle time of a feedback signal.

Clause 8. The lock-detection circuit of any of the clauses 5 to 7, wherein:

the first timer is an analog timer;

the first timer is configured to de-assert a first timer output when its reset input is asserted and to assert the first timer output a first wait time after the start/reset input was most recently asserted; and the first wait time is longer than a longest first cycle time of a reference signal and longer than a longest second cycle time of a feedback signal.

Clause 9. A lock detection method that can be used in a phase-locked loop or a delay-locked loop and using an UP signal and a DN signal provided by a phase-frequency detector, the lock detection method comprising:

receiving the UP signal and the DN signal from the phase-frequency detector;

filtering the UP signal and the DN signal to suppress signals with a duration shorter than a minimum duration to obtain a filtered UP signal and a filtered DN signal;

using the filtered UP signal and the filtered DN signal to reset and start a first timer; and when the first timer has timed out, outputting a LOCK detected signal;

wherein:

the minimum duration is longer than a spike in the UP signal, including a spike broadened by jitter, and longer than a spike in the DN signal, including a spike broadened by jitter; and the minimum duration is longer than an expected duration of a phase error correcting pulse when the phase-locked loop or the delay-locked loop is in lock.

Clause 10. The lock detection method of clause 9, wherein:

the filtered UP signal resets and starts the first timer and the filtered DN signal resets and starts a second timer, and wherein outputting the LOCK detected signal comprises combining output signals from the first timer and the second timer.

Considerations

Although the description has been described with respect to specific implementations thereof, these specific implementations are merely illustrative, and not restrictive. The description may reference specific structural implementations and methods and does not intend to limit the technology to the specifically disclosed implementations and methods. The technology may be practiced using other features, elements, methods and implementations. Implementations are described to illustrate the present technology, not to limit its scope, which is defined by the claims. Those of ordinary skill in the art recognize a variety of equivalent variations on the description above.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although the description has been described with respect to specific implementations thereof, these specific implementations are merely illustrative, and not restrictive. For instance, many of the operations can be implemented on a printed circuit board (PCB) using off-the-shelf devices, in a System-on-Chip (SoC), application-specific integrated circuit (ASIC), programmable processor, a coarse-grained reconfigurable architecture (CGRA), or in a programmable logic device such as a field-programmable gate array (FPGA), obviating the need for at least part of any dedicated hardware. Implementations may be as a single chip, or as a multi-chip module (MCM) packaging multiple semiconductor dies in a single package. All such variations and modifications are to be considered within the ambit of the disclosed technology the nature of which is to be determined from the foregoing description.

Any suitable technology for manufacturing electronic devices can be used to implement the circuits of specific implementations, including CMOS, FinFET, GAAFET, BiCMOS, bipolar, JFET, MOS, NMOS, PMOS, HBT, MESFET, etc. Different semiconductor materials can be employed, such as silicon, germanium, SiGe, GaAs, InP, GaN, SiC, graphene, etc. Circuits may have single-ended or differential inputs, and single-ended or differential outputs. Terminals to circuits may function as inputs, outputs, both, or be in a high-impedance state, or they may function to receive supply power, a ground reference, a reference voltage, a reference current, or other. Although the physical processing of signals may be presented in a specific order, this order may be changed in different specific implementations. In some specific implementations, multiple elements, devices, or circuits shown as sequential in this specification can be operating in parallel.

It will also be appreciated that one or more of the elements depicted in the drawings/figures can also be implemented in a more separated or integrated manner, or even removed or rendered as inoperable in certain cases, as is useful in accordance with a particular application.

Thus, while specific implementations have been described herein, latitudes of modification, various changes, and substitutions are intended in the foregoing disclosures, and it will be appreciated that in some instances some features of specific implementations will be employed without a corresponding use of other features without departing from the scope and spirit as set forth. Therefore, many modifications may be made to adapt a particular situation or material to the essential scope and spirit.

The invention claimed is:

1. A lock-detection circuit for use in a phase-locked loop or a delay-locked loop, the lock-detection circuit comprising:

a first signal-duration filter configured to receive an up signal (UP) and to output a filtered UP signal that includes a part of the UP signal that exceeds a minimum duration;

a second signal-duration filter configured to receive a down signal (a DN signal) and to output a filtered DN signal that includes a part of the DN signal that exceeds the minimum duration;

a first timer coupled with an output of the first signal-duration filter and configured to receive the filtered UP signal;

a second timer coupled with an output of the second signal-duration filter and configured to receive the filtered DN signal; and an output logic circuit with inputs coupled with the first timer and the second timer and configured to assert a LOCK detected signal when both a first timer output and a second timer output are asserted;

wherein:

the minimum duration is longer than a spike in the UP signal, including a spike broadened by jitter, and longer than a spike in the DN signal, including a spike broadened by jitter; and the minimum duration is longer than an expected duration of a phase error correcting pulse when the phase-locked loop or the delay-locked loop is in lock.

2. The lock-detection circuit of claim 1, wherein:

the first signal-duration filter includes a first logic circuit with a first logic circuit input and a second logic circuit input, and a delay circuit with a delay circuit input and a delay circuit output;

the first logic circuit input and the delay circuit input are coupled with an UP signal input, the second logic circuit input is coupled with the delay circuit output, and a first logic circuit output is coupled with a first signal-duration filter output;

the delay circuit outputs a delayed UP signal, wherein the delayed UP signal follows the UP signal with a delay equal to the minimum duration; and the first logic circuit asserts its output when both the first logic circuit input and the second logic circuit input are asserted.

3. The lock-detection circuit of claim 1, wherein:

the first timer is a counter with a reset input coupled with an output of the first signal-duration filter, a clock input coupled with a reference signal input, and an enable input coupled with a first timer output;

the first timer is configured to de-assert the first timer output when its reset input is asserted and to assert the first timer output a first wait time after the reset input was most recently asserted; and the first wait time is longer than a longest first cycle time of a reference signal and longer than a longest second cycle time of a feedback signal.

4. The lock-detection circuit of claim 1, wherein:

the first timer is an analog timer with a start input coupled with an output of the first signal-duration filter; and the first timer is configured to assert the first timer output a first wait time after the start input was most recently asserted.

5. A lock detection method that can be used in a phase-locked loop or a delay-locked loop and using an UP signal and a DN signal provided by a phase-frequency detector, the lock detection method comprising:

receiving the UP signal and the DN signal from the phase-frequency detector;

filtering the UP signal and the DN signal to suppress signals with a duration shorter than a minimum duration to obtain a filtered UP signal and a filtered DN signal;

using the filtered UP signal and the filtered DN signal to reset and start a first timer; and when the first timer has timed out, outputting a LOCK detected signal;

wherein:

the minimum duration is longer than a spike in the UP signal, including a spike broadened by jitter, and longer than a spike in the DN signal, including a spike broadened by jitter; and the minimum duration is longer than an expected duration of a phase error correcting pulse when the phase-locked loop or the delay-locked loop is in lock.

6. The lock detection method of claim 5, wherein:

the filtered UP signal resets and starts the first timer and the filtered DN signal resets and starts a second timer, and wherein outputting the LOCK detected signal comprises combining output signals from the first timer and the second timer.

* * * * *